United States Patent [19]

Elam

[11] 4,128,522
[45] Dec. 5, 1978

[54] METHOD AND MASKANT COMPOSITION FOR PREVENTING THE DEPOSITION OF A COATING ON A SUBSTRATE

[75] Inventor: Richard C. Elam, Manchester, Conn.

[73] Assignee: Gulf & Western Industries, Inc., New York, N.Y.

[21] Appl. No.: 710,060

[22] Filed: Jul. 30, 1976

[51] Int. Cl.² ............................................. C08K 3/08
[52] U.S. Cl. .................................. 260/32.8 R; 106/2; 106/1.25; 260/33.4 R; 260/33.6 UA; 260/33.8 UA; 260/29.6 MM; 260/42.22; 427/259; 428/457; 428/461; 428/652
[58] Field of Search ...................... 260/32.8 R, 42.22; 428/652, 457; 106/1, 2

[56] References Cited

U.S. PATENT DOCUMENTS

| 2,941,894 | 6/1960 | McAdow et al. | 260/42.22 |
|---|---|---|---|
| 3,436,249 | 4/1969 | Lambert et al. | 428/652 |
| 3,450,512 | 6/1969 | Maxwell | 428/652 |
| 3,544,348 | 12/1970 | Boone et al. | 427/226 |
| 3,575,900 | 4/1971 | Ponyik | 260/32.8 R |
| 3,803,111 | 4/1974 | Munro et al. | 260/32.8 R |
| 4,009,146 | 2/1977 | Cork et al. | 260/32.8 R |

Primary Examiner—Herbert J. Lilling
Attorney, Agent, or Firm—Gregory J. Battersby; Thomas E. Harrison, Jr.

[57] ABSTRACT

A method of and composition for preventing the deposition of a coating on a predetermined portion of a substrate is provided, said method including the principle step of applying a maskant composition to said predetermined portion prior to coating. The composition includes a reduceable material capable of reacting with and being reduced by said coating; an inhibitor for controlling the reaction between the coating and the reduceable material; and a resinous binder vehicle in which the reduceable material and the inhibitor are suspended.

16 Claims, 1 Drawing Figure

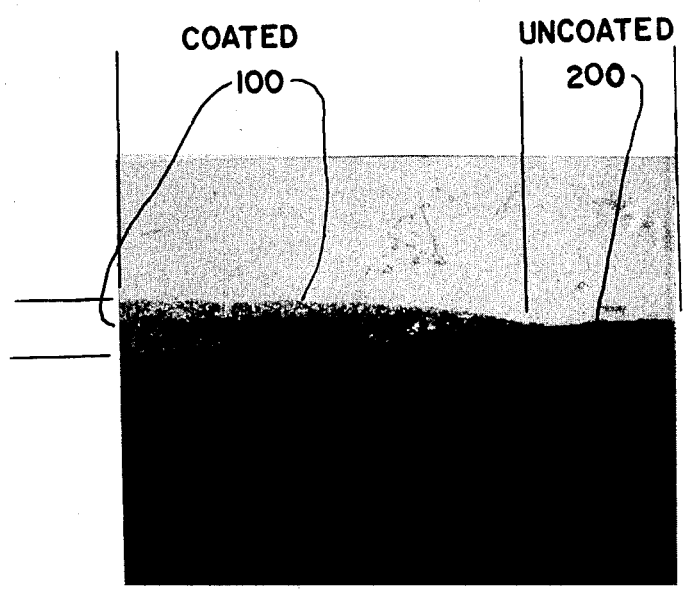

METHOD AND MASKANT COMPOSITION FOR PREVENTING THE DEPOSITION OF A COATING ON A SUBSTRATE

BACKGROUND OF THE INVENTION

This invention relates generally to a method of and maskant composition for preventing the deposition of a coating on a predetermined portion of a substrate and, more particularly, to such a method and maskant which prevents the deposition of an aluminide-type coating on a nickel, cobalt or iron-based substrate by reacting with the aluminum containing vapors produced during the coating/deposition process thereby preventing deposition of the coating on the predetermined masked portion of the substrate.

The coating of metallic substrates is extremely common, particularly in the automotive and aerospace industries where it is desirable that a particular part possess numerous and varied physical properties. By coating or plating an alloy or other coating onto the surface of such a part, certain desirable surface physical properties, not otherwise characterstic to the substrate, may be achieved. For example, in the gas turbine engine industry, turbine blades and nozzle guide vanes are commonly fabricated from high temperature, nickel, cobalt and iron-based alloys since such alloys generally possess excellent strength characteristics at the elevated temperatures at which these blades and vanes are designed to operate. Such alloys are, however, susceptable to surface oxidation with its corresponding deleterious effects which may result in premature part failure. In order to minimize this problem, coatings such as aluminides are commonly applied. See, in this regard, U.S. Pat. Nos. 3,450,512 which issued to D. H. Maxwell on June 17, 1969; 3,436,249 which issued on Apr. 1, 1969 to G. Lambert et al.; and 3,544,348 which issued to D. H. Boone et al. on Dec. 1, 1970.

These coatings may be applied to the substrate in a variety of ways including, for example, pack cementation and hot spraying. With respect to either process, since only certain portions of the substrate are to be coated, it becomes necessary to mask off or otherwise prevent deposition of the coating on the areas not to be coated.

Historically, there have been two commonly accepted ways in which deposition can be prevented. The first is a complete physical block, normally accomplished by the use of a thick layer of an inert material. The second common way to prevent deposition is by the use of a sacrificial type maskant which will be sacrificed in favor of the substrate.

A third approach which, heretofore, has not been successfully employed due principally to the inability to control the reaction, constitutes the masking of the portion of the substrate to be protected with a reactive-type masking material capable of chemically reacting with the vapors produced during the coating process to thereby prevent deposition. Such a reactive type maskant, when fully controlled, offers numerous advantages over the physical block and sacrificial types. Among these advantages are the ability to use a thinner layer of maskant thus reducing cost; the ability to insure complete prevention of coating deposition in covered areas; and, when properly controlled, the ability to precisely control the line of demarcation between the coated and uncoated areas.

In the past, attempts at using reactive-type maskants have failed due principally to the inability to control the reaction between the maskant and the coating, resulting in it having been, heretofore, impossible to control the exact line of demarcation between the masked and unmasked areas.

Against the foregoing background, it is a primary objective of the present invention to provide a controllable, reactive-type maskant composition.

It is another objective of the present invention to provide a controllable, reactive type maskant composition which for use in preventing the deposition of aluminum based coatings on nickel, cobalt and iron-based alloys.

It is another object of the present invention to provide a method for preventing the deposition of a coating on a predetermined portion of a substrate using a reactive-type maskant composition.

SUMMARY OF THE PRESENT INVENTION

To the accomplishment of the foregoing objects and advantages, the present invention, in brief summary, comprises a method of and maskant composition for preventing the deposition of a coating on a predetermined portion of a substrate. The method comprises the principle step of applying the maskant composition to the predetermined portion of the substrate prior to coating. The maskant composition comprises a solids portion which is suspended in a suitable binder vehicle. The solids portion includes a reduceable material capable of reacting with and being reduced by the coating; an inhibitor for controlling the rate of reduction of the reduceable material; and an inert diluent.

BRIEF DESCRIPTION OF THE DRAWINGS

The foregoing and still other objects and advantages of the present invention will be more apparent from the detailed description of the invention in connection with the accompanying drawing wherein:

The FIGURE is a 200X photomicrograph of a nickel based substrate illustrating the delineation between an area coated with an aluminide coating and an uncoated area wherein coating was prevented by prior masking with the maskant composition of and according to the method of the present invention.

DESCRIPTION OF THE PREFERRED EMBODIMENTS

As previously stated, the present invention contemplates a controllable, reactive-type maskant for use principally in masking nickel, cobalt and iron-based substrates during surface coating with aluminum based coatings. The Figure is a photomicrograph showing the line of demarcation between an area 100 coated with an aluminide coating and an uncoated area 200 wherein coating was prevented by having masked the area 200 prior to coating.

The maskant herein disclosed is comprised principally of the following ingredients:

(1) a reduceable material such as, for example, titanium dioxide;

(2) an inhibitor such as, for example, nickel;

(3) an inert material such as, for example, aluminum oxide; and (4) a vehicle such as, for example, a mixture of methylethyl-ketone and an acrylic resin.

A reactive-type maskant functions to prevent the deposition of the coating on the substrate by reacting with the coating being applied. When an aluminum based or aluminide coating is to be applied by pack cementation on a nickel, cobalt or iron-based substrate, the coating reacts with the substrate and effects formation of a surface alloy, i.e. nickel aluminide, at the surface substrate while generating aluminum containing vapors. In order to prevent deposition using a reactive-type maskant, the maskant should include an ingredient capable of reacting with the aluminum containing vapors generated during the coating process. A preferred type of reaction between the maskant and the coating is a reduction reaction and, accordingly, the maskant should preferably include an ingredient capable of being reduced by the aluminum of the pack coating.

A reactive type maskant suitable for use in preventing the deposition of an aluminide coating on a nickel, cobalt or iron substrate should include a solids portion suspended in a vehicle. The solids portion preferably includes a reduceable material, preferably an oxide which is thermodynamically less stable than the oxide which would be formed by the principle reactive ingredient of the coating, i.e. aluminum and thus be capable of reacting with and being reduced by the aluminum in the coating. Examples of such reduceable materials include zirconium oxide, ferric oxide, titanium sesquioxide, nickelous oxide and other oxides which have a higher free energy of formation than aluminum oxide and are accordingly less stable than aluminum oxide. A preferred reduceable material is titanium dioxide. When titanium dioxide is used, it is reduced by the aluminum freeing elemental titanium which is coated with aluminum to form a titanium aluminide. This prevents deposition of the pack coating on the masked portion of the substrate since the underlying substrate is prevented from reacting with the aluminum containing vapor generated during pack coating.

While the maskant may include any amount of reduceable material in excess of about 5% by weight of the solids portion of the composition, a preferred amount is in the range of from about 5% to about 20% by weight since it has been found that amounts in this range permit greater control over the area to be masked. A particularly preferred amount of reduceable material is between about 8% and about 12% by weight of the solids portion of the composition.

The maskant should also contain an inhibitor which serves to control the rate of reaction between the reduceable material and the pack coating. Failure to control this reduction reaction may result in excessive volumetric change of the maskant, thus expanding the masked area to a surface area beyond the original masked boundaries. The inhibitor selected should be incapable of reacting with the substrate, especially at temperatures below about 2200° F.; it should have a melting point above about 2200° F.; and it should be capable of being readily aluminized.

Preferred inhibitors include, for example, refractory metals including, but not limited to, tungsten, molybdinum and tantalum; as well as cobalt chromium and iron. A particularly preferred inhibitor material is nickel.

The inhibitor may be included in the maskant in an amount up to about 95% by weight of the solids portion of the composition with an amount within the range of from about 5% to about 15% by weight being preferred. A most preferred amount of inhibitor is within the range of from about 8% to about 12% by weight of the solids portion since an amount within this range results in a fully controllable maskant.

The addition of an inert oxide material to the composition is also preferred since such a material aids, by dilution, in controlling the reaction between the reduceable material and the pack coating. Inert oxide materials selected should have a free energy of formation no higher than the free energy of formation of aluminum oxide and they may have a lower free energy of formation than aluminum oxide. Preferred inert materials include, but are not limited to, the oxides of most rare earth metals such as, for example, scandium, yttrium and lanthanum, and the oxides of refractory elements such as, for example, hafnium, thorium and tantalum. A particularly preferred inert oxide material is aluminum oxide.

The inert material may be added to the solids portion of the maskant composition in an amount up to about 95% of the solids portion of the total maskant composition. A preferred amount of inert material is within the range of from about 60% and about 90% by weight, and a most preferred amount is between about 75% and about 85% by weight of the solids portion.

The vehicle in which the solids portion is suspended may constitute any suitable binder and preferably includes a mixture of a resinous material and a solvent. The resinous material should be capable of binding all ingredients of the solid portions together at temperatures at and above the temperature at which deposition begins, ie. 700° F. and the solvent should be able to enhance the drying of the resinous material so that external heat sources are not required as well as aiding in dispensing the binder material. Suitable vehicles include, for example, a mixture of a resinous material selected from the group consisting of cellulose based organics, gum arabic and acrylic resins and a solvent selected from the group consisting of alcohol, acetone, toluene, ethyl-methyl-ketone, trichlorethylene and water. A preferred vehicle comprises a mixture, in even proportions, of methyl-ethyl-ketone as the solvent and an acrylic resin as the resinous material. A preferred acrylic resin is an acrylic ester polymer which is dissolved in toluene such as, for example, an Acryloid resin marketed by Rohm & Haas of Philadelphia, Pennsylvania. A preferred grade of Acryloid resin is Grade B-7-50% which is a thermoplastic polymeric derivative of an acrylic and a methacrylic acid.

The ingredients forming the solids portion of the maskant may be blended in any order, preferably with each ingredient being added during mechanical mixing. The admixed solid ingredients are then added to the binder vehicle in a volumetric ratio of at least about one part solids to one part vehicle and preferably in a ratio of about two parts solids to one part vehicle.

The maskant may be applied to the portion of the substrate to be masked by conventional methods including, for example, by dipping the substrate into the maskant, by an applicator such as a brush or spatula or by spraying. The maskant should be permitted to dry prior to coating.

After the coating is applied to the unmasked portions of the substrate, the maskant may be removed by fracturing it with an appropriate tool such as a hammer or plastic mallet and then peeling the fractured portion of the maskant away from the substrate. The maskant can also be removed using a scrapping device, wire brush or by a light grit blasting.

Effectiveness of the maskant may be measured by the use of conventional quality control techniques such as by the use of a metallograph or visually by the use of a heat tint test where the coated substrate is heated at an air temperature of about 1050° F. for one hour which results in the aluminum containing coated being tinted a golden color and the uncoated nickel based substrate being tinted blue.

The following examples serve to further illustrate the present invention and are not construed as limiting the scope of the invention:

EXAMPLE I

In order to more fully illustrate the preparation of a maskant according to the present invention, a maskant composition comprising the following ingredients was admixed at ambient temperatures:

| Ingredients | % By Weight | % By Volume |
| --- | --- | --- |
| Solids | | |
| nickel | 10% | |
| titanium dioxide | 10% | |
| aluminum oxide | 80% | |
| Vehicle | | |
| methyl-ethyl-ketone | | 50% |
| Acryloid resin | | 50% |

The ingredients comprising the solids portion of the maskant were blended together in a mixing device and added to the vehicle in a volumetric ratio of two parts solids to one part vehicle thus producing a viscous blend which was spread out on a nickel alloy substrate and allowed to dry. An aluminide pack coating was applied and, after coating, the maskant was removed and the substrate tested both metallographically and with a heat tint test. The tests indicated complete masking of the masked area and virtually no migration of the uncoated area beyond the previously masked area indicating that the reactive type maskant was totally effective and completely controllable.

EXAMPLE II

In order to demonstrate the effects of using a reactive type maskant wherein an inert material was not included and wherein the amount of reduceable material was doubled, a maskant composition was prepared and applied to a nickel substrate according to the procedure of Example I, the maskant including the following ingredients:

| Ingredients | % By Weight | % By Volume |
| --- | --- | --- |
| Solids | | |
| nickel | 80% | |
| titanium dioxide | 20% | |
| Vehicle | | |
| methyl-ethyl-ketone | | 50% |
| Acryloid resin | | 50% |

Upon removal of the maskant after coating, metallographic and heat tint tests indicated that complete masking had occured in the masked area however, there was minor migration of the uncoated areas beyond the masked areas, thus indicating that while the maskant was effective, it was partially uncontrollable.

EXAMPLE III

In order to demonstrate the effects of using a reactive type maskant which did not include an inert material and wherein equal percentages of reduceable material and inhibitor were used, a maskant composition having the following ingredients was prepared and applied to a nickel-based substrate according to the procedure of Example I:

| Ingredients | % By Weight | % By Volume |
| --- | --- | --- |
| Solids | | |
| nickel | 50% | |
| titanium dioxide | 50% | |
| Vehicle | | |
| methyl-ethyl-ketone | | 50% |
| Acryloid resin | | 50% |

Upon removal of the maskant after coating, metallographic and heat tint tests indicated that complete masking had occured in the masked area however, there was major migration of the uncoated areas beyond the masked area indicating that while the maskant was effective, it was uncontrollable.

EXAMPLE IV

In order to demonstrate the effects of using a reactive type maskant including only a reducable material and an inert material with no inhibitor, a maskant composition having the following ingredients was prepared and applied to a substrate according to the method of Example I:

| Ingredients | % By Weight | % By Volume |
| --- | --- | --- |
| Solids | | |
| aluminum oxide | 95% | |
| titanium dioxide | 5% | |
| Vehicle | | |
| methyl-ethyl-ketone | | 50% |
| Acryloid resin | | 50% |

Upon removal of the maskant, the metallographic and tint tests indicated incomplete masking in the masked area with no migration of the uncoated area beyond the masked portion thus indicating a maskant composition which was not totally effective.

EXAMPLE V

In order to demonstrate the effects of using a maskant composition consisting entirely of an inhibitor, nickel and therefore having no reduceable material, a maskant composition was prepared and mixed with the vehicle of and according to the procedures of Example I. The maskant was applied to a nickel substrate which was coated and tested according to the procedure of Example I.

The tests performed indicated that masking was not complete with some leakage appearing at the periphery within the masked area. There were no effects beyond the masked area. The absence of a reduceable material resulted in the maskant being of the sacrificial type.

Although the foregoing Examples illustrate the preparation and use of a maskant composition on a nickel based substrate to which was applied an aluminum base coating, it will be appreciated that similar maskants can be effectively used in conjunction with different substrates and with different coatings. Accordingly, the present invention should be limited only by the scope of the appended claims.

Wherefore I claim:

1. A maskant composition for use in preventing the deposition of a coating on a predetermined portion of a substrate, said composition comprising:
   a solids portion including a reduceable material capable of reacting with and being reduced by said coating, said reduceable material comprising in excess of at least about 8% by weight of said solids portion; and an inhibitor in an amount sufficient to control the reaction between the reduceable material and the coating wherein said amount sufficient comprises an amount up to about 92% by weight of said solids portion; and
   a binder vehicle including a resinous material and a solvent in which the solids portion is suspended.

2. The maskant composition of claim 1 further including an inert material.

3. The maskant composition of claim 1 wherein said coating is an aluminum based coating and wherein said substrate is a nickel based alloy.

4. The maskant composition of claim 3 wherein said reduceable material has a higher free energy of formation than aluminum oxide.

5. The maskant composition of claim 4 wherein said reduceable material is selected from the group consisting of zirconium oxide, ferric oxide, titanium sesquioxide, nickelous oxide and titanium dioxide.

6. The maskant composition of claim 3 wherein said inhibitor is incapable of reacting with said nickel based substrate and has a melting point above about 2200° F.

7. The maskant composition of claim 6 wherein said inhibitor is selected from the group consisting of tungsten, molybdinum, tantalum, cobalt, iron, chromium and nickel.

8. A maskant composition for use in preventing the deposition of an aluminum-based, pack coating on a pre-determined portion of a nickel based substrate, said composition comprising:
   a solids portion including between about 8% and about 12% by weight of titanium dioxide; between about 75% and about 85% by weight of aluminum oxide; and between about 8% and about 12% by weight of nickel; and
   a resinous binder vehicle in which said solids portion is suspended, said vehicle including about 50% by volume of methylethyl-ketone and about 50% by volume of an acrylic resin.

9. A maskant composition for use in preventing the deposition of a coating on a predetermined portion of a substrate, said composition comprising:
   a solids portion including:
      a reduceable material in an amount in excess of about 8% by weight of said solids portion and capable of being reduced by said coating, said reduceable material being selected from the group consisting of zirconium oxide, ferric oxide, titanium sesquioxide, nickelous oxide and titanium dioxide; and
      an inhibitor in an amount sufficient to control the reduction reaction between the coating and the reduceable material, said amount sufficient comprising an amount up to about 92% by weight of said solids portion, said inhibitor being selected from the group consisting of tungsten, molybdenum, tantalum, cobalt, iron, chromium and nickel; and
   a resinous binder vehicle including a solvent and a resinous material in which said solids portion is suspended.

10. The maskant composition of claim 9 further including an inert material selected from the group consisting of the oxides of rare earth metals, the oxides of refractory metals and aluminum oxide.

11. A maskant composition for use in preventing the deposition of an aluminum based coating on a predetermined portion of a nickel based substrate, said composition comprising:
    a solids portion including:
       a reduceable material capable of reacting with and being reduced by said aluminum coating, said reduceable material being included in an amount between about 8% and about 20% by weight of the solids portion of said composition;
       an inhibitor for controlling the reaction between the reduceable material and the aluminum coating, wherein said inhibitor is included in an amount between about 5% and about 20% by weight of the solids portion of said composition;
       an inert material in an amount between about 60% and about 90% by weight of the solids portion of said composition; and
    a resinous binder vehicle in which the solids portion is suspended.

12. The maskant composition of claim 11 wherein said reduceable material is titanium dioxide in an amount between about 8% and about 12% by weight of the solids portion of said composition.

13. The maskant composition of claim 12 wherein said inhibitor is present in an amount between about 8% and about 12% by weight of the solids portion of said composition.

14. The maskant composition of claim 13 wherein said inert material is aluminum oxide in an amount between about 75% and about 85% by weight of the solids portion of said composition.

15. The maskant composition of claim 14 wherein said resinous binder vehicle includes equal percentages of a solvent and an acrylic binder.

16. The maskant of claim 15 wherein said solvent is methyl-ethyl-ketone and wherein said acrylic binder is an acrylic ester polymer dissolved in toluene.

* * * * *